(12) United States Patent
Kirn

(10) Patent No.: US 7,151,403 B2
(45) Date of Patent: Dec. 19, 2006

(54) ADAPTIVE SELF-CALIBRATION METHOD AND APPARATUS

(75) Inventor: Larry Kirn, East Lansing, MI (US)

(73) Assignee: Jam Technologies, Inc., Boston, MA (US)

( * ) Notice: Subject to any disclaimer, the term of this patent is extended or adjusted under 35 U.S.C. 154(b) by 34 days.

(21) Appl. No.: 10/916,032

(22) Filed: Aug. 11, 2004

(65) Prior Publication Data

US 2005/0068097 A1 Mar. 31, 2005

Related U.S. Application Data

(60) Provisional application No. 60/494,214, filed on Aug. 11, 2003.

(51) Int. Cl.
*H03F 3/217* (2006.01)
(52) U.S. Cl. ........................ 330/2; 330/207 A
(58) Field of Classification Search ............ 330/207 A
See application file for complete search history.

(56) References Cited

U.S. PATENT DOCUMENTS 6,316,992 B1 * 11/2001 Miao et al. .................... 330/2

* cited by examiner

*Primary Examiner*—Steven J. Mottola
(74) *Attorney, Agent, or Firm*—Gifford, Krass, Groh, Sprinkle, Anderson & Citkowski, PC

(57) ABSTRACT

Feedback for self-calibration of any parameter in an analog and/or digital system is described wherein a system quality factor can be represented by a voltage or current differential. The preferred embodiment is operative to alternately supply two or more optimally equivalent currents or voltages from such a system, detect amplitude and/or phase feedback of resultant output signal at the frequency of the alternation, and use feedback to modify a calibration value, voltage, or current so as to minimize or maximize the feedback, thus effecting self-calibration of the system. Such a method and attendant apparatus enables system self-calibration without need of any high-precision or high-cost components.

3 Claims, 1 Drawing Sheet

ADAPTIVE SELF-CALIBRATION METHOD AND APPARATUS

REFERENCE TO RELATED APPLICATION

This application claims priority from U.S. Provisional Patent Application Ser. No. 60/494,214, filed Aug. 11, 2003, the entire content of which is incorporated herein by reference.

FIELD OF THE INVENTION

This invention relates generally to switching amplifiers and, in particular, to methods and apparatus for self-calibration using low-cost feedback components.

BACKGROUND OF THE INVENTION

Self-calibration is a cost-effective method of achieving high-accuracy systems using low-accuracy components. In most systems, DC-coupled feedback paths are used to ensure greatest accuracy. However, DC-coupled feedback circuitry must deliver accuracy equal to or higher than that expected of the entire system. This requisite accuracy of feedback components dramatically increases cost, sometimes even above that of the remainder of the system.

A need therefore exists of a feedback method and apparatus for self-calibration wherein low-cost components are suitable for feedback circuitry as well.

SUMMARY OF THE INVENTION

The present invention facilitates feedback for self-calibration of any parameter in an analog and/or digital system wherein a system quality factor can be represented by a voltage or current differential. The preferred embodiment is operative to alternately supply two or more optimally equivalent currents or voltages from such a system, detect amplitude and/or phase feedback of resultant output signal at the frequency of the alternation, and use feedback to modify a calibration value, voltage, or current so as to minimize or maximize the feedback, thus effecting self-calibration of the system. Such a method and attendant apparatus enables system self-calibration without need of any high-precision or high-cost components.

DETAILED DESCRIPTION OF THE INVENTION

Figure 1:
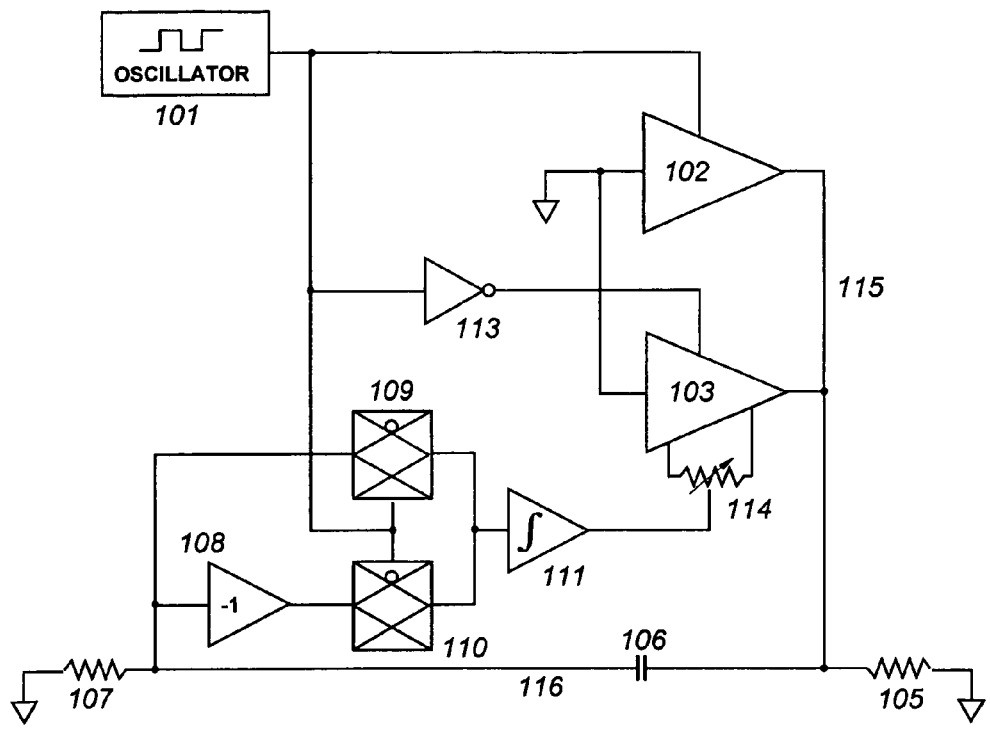
FIG. 1 shows a self-calibrating system of two amplifiers, incorporating the present invention.

Referring now to FIG. 1, amplifiers 102 and 103 are shown with associated circuitry operative to null the difference of their offset voltages to zero. Amplifiers 102 and 103 are shown with grounded inputs for simplicity, a condition not otherwise required. The outputs of the amplifiers 102 and 103 are wire-OR connected to load 105, such that one, both, or neither amplifier may drive load 105, under control of individual tri-state enable inputs shown at the top of both amplifiers 102 and 103.

Square-wave oscillator 101 supplies a control waveform to alternately enable and disable the output of amplifier 102. Inverter 113 inverts the control waveform, thus enabling amplifier 103 when amplifier 102 is disabled, and disabling amplifier 103 when amplifier 102 is enabled. The net effect of the foregoing is that amplifiers 102 and 103 alternately drive load 105 with voltages approaching ground, under control of oscillator 101. Being physical devices, the offset voltages of amplifiers 102 and 103 will produce a minute square wave on path 115 at load 105, resulting from the operation discussed.

Any DC component of minute square wave on path 115 is removed by capacitor 106 and re-biased to ground by resistor 107. This resultant AC-coupled minute square wave 116 is applied to inverting amplifier 108 and transmission gate 109. The output of the inverting amplifier 108 is applied to transmission gate 110. The outputs of said transmission gates 109 and 110 are joined in a wire-OR connection for input to integrating amplifier 111. Note that transmission gates 109 and 110 are connected such that transmission gate 109 is enabled when the output of oscillator 101 is high, connecting said minute square wave 116 to integrating amplifier 111. Note also that transmission gate 110 is enabled when the output of oscillator 101 is low, connecting a phase-inverted version 117 of minute square wave 116 (from inverting amplifier 108) to integrating amplifier 111.

From the discussion of FIG. 1 to this point it can be seen that a high output from oscillator 101 enables amplifier 102 and gates non-inverted AC-coupled feedback to integrating amplifier 111, and that a low output from oscillator 101 enables amplifier 103 and gates inverted AC-coupled feedback to integrating amplifier 111. The output 118 of integrating amplifier 111 controls voltage-controlled resistor 114, which presumably controls the eventual output offset voltage of amplifier 103. It is assumed for illustrative purposes that increasing control voltage 118 to resistor 114 from integrating amplifier 111 will result in increasing offset voltage from amplifier 103. In that the feedback voltage to integrating amplifier 111 is inverted by inverting amplifier 108 when amplifier 103 is enabled, a negative feedback loop is thus formed.

Note that the resultant minute square wave 116 feedback described above is a direct result of the difference in offset voltages of amplifiers 102 and 103. In that the offset voltage of amplifier 103 only is being calibrated, the foregoing scheme ensures correct feedback polarity at all times.

Figure 2:
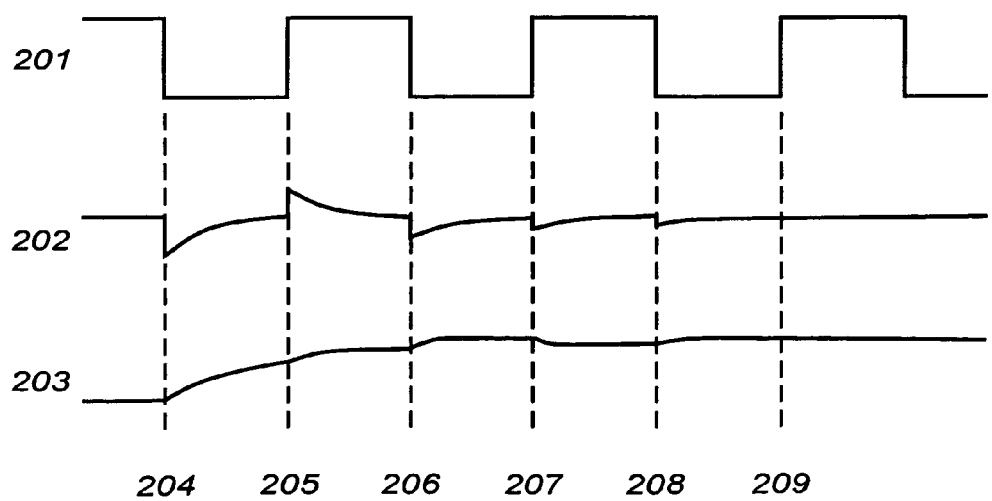
FIG. 2 shows the control waveforms and resultant voltages of the circuit of FIG. 1.

Referring now to FIG. 2, trace 201 shows voltage output of oscillator 101, trace 202 shows feedback voltage 116, and trace 202 shows resultant control voltage 118 from integrating amplifier 111 to voltage-controlled resistor 114, all of FIG. 1. It is assumed that voltage 118 shown in trace 203 starts from zero, below the voltage necessary to null offset voltages of amplifiers 102 and 103 to approach the same value.

At time marker 204, the falling edge of oscillator 101 results in enabling of amplifier 103, which output an offset voltage below the preceding offset voltage of amplifier 102, previously enabled when the output of oscillator 101 was high. The lower offset voltage of amplifier 102 output after time marker 204 results in a negative-going spike in feedback voltage 116, seen in trace 202. This negative-going spike is inverted by inverting amplifier 108 and gated by transmission gate 110 to integrating amplifier 111, the output of which resultantly increases, as seen in trace 203. As capacitor 106 charges through resistor 107 after time marker 204, this voltage 116 can be seen to approaches zero in trace 202.

At time marker 205, oscillator 101 enables amplifier 102, resulting in a positive-going spike in feedback voltage 116, seen in trace 202. This spike is gated through transmission gate 109 to integrating amplifier 111, further increasing its output voltage 118, as seen in trace 203. By the relative amplitudes of spikes in trace 202 at time markers 204 and 205, it can be seen that the offset voltage of amplifier 103 is still below that of amplifier 102 at time marker 205, but is approaching it. At time marker 206, the negative-going spike in feedback voltage 116 seen in trace 202 again indicates that the offset voltage of amplifier 103 is below that of amplifier 102, further raising the control voltage 118 seen in trace 203.

At time marker 207, a negative-going spike in feedback voltage 116 seen in trace 202 indicates an overshoot, wherein the offset voltage of amplifier 103 is now above that of amplifier 102. The negative-going spike seen in trace 202 therefore reduces the control voltage 118 seen in trace 203. At time marker 208, the small negative-going spike in feedback voltage 116 seen in trace 202 causes a proportional increase from integrating amplifier 111 in control voltage 118 seen in trace 203. The control loop is approaching null, and, at time marker 209, it can be seen that no further visible correction can be effected.

By the method and apparatus described above, a self-corrective system can achieve high accuracy without need of high-accuracy components. Although shown with a single-ended load, differential loads are also anticipated. Use of the present invention facilitates feedback for self-calibration of any parameter in an analog and/or digital system wherein a system quality factor can be represented by a voltage or current differential. Whereas multiple devices, such as amplifiers 102 and 103, are shown nulled, use of the present invention with multiple states of a single device is foreseen.

I claim:

1. A self-calibration method, comprising the steps of:
    alternately supplying two or more substantially equivalent currents or voltages to a load at a frequency;
    detecting alternating current (AC) amplitude and/or phase feedback at the load at the frequency of the alternation; and
    using the feedback to modify a calibration value, voltage, or current so as to minimize feedback and cancel AC components in the output signal.

2. The self-calibration method of claim 1, wherein the voltages and currents are analog or digital.

3. The self-calibration method of claim 1, including single-ended or differential load.

* * * * *